(12) United States Patent
Shimoda

(10) Patent No.: US 6,864,123 B2
(45) Date of Patent: Mar. 8, 2005

(54) MEMORY DEVICE AND MANUFACTURING METHOD THEREFOR

(75) Inventor: Tatsuya Shimoda, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 122 days.

(21) Appl. No.: 09/814,794

(22) Filed: Mar. 23, 2001

(65) Prior Publication Data

US 2001/0039124 A1 Nov. 8, 2001

(30) Foreign Application Priority Data

Mar. 23, 2000 (JP) ........................................ 2000-082165

(51) Int. Cl.⁷ .............................................. H01L 21/82
(52) U.S. Cl. ........................ 438/130; 438/778; 438/599
(58) Field of Search ................... 438/599, 130, 438/384, 385, 778, FOR 220, FOR 210; 257/E21.538; 365/51, 100, 103

(56) References Cited

U.S. PATENT DOCUMENTS

| | | | | |
|---|---|---|---|---|
| 3,774,170 A | * | 11/1973 | Koch | ........................... 365/94 |
| 4,233,671 A | * | 11/1980 | Gerzberg et al. | ........... 365/105 |
| 4,419,741 A | * | 12/1983 | Stewart et al. | ................ 365/72 |
| 4,646,266 A | * | 2/1987 | Ovshinsky et al. | ......... 365/105 |
| 5,266,222 A | * | 11/1993 | Willis et al. | ................ 508/206 |
| 5,272,370 A | * | 12/1993 | French | ........................ 257/353 |
| 5,389,497 A | * | 2/1995 | Yoshioka et al. | ............ 430/315 |
| 5,441,907 A | * | 8/1995 | Sung et al. | ................. 438/237 |
| 5,891,778 A | * | 4/1999 | Wen | ............................ 438/276 |
| 6,236,587 B1 | * | 5/2001 | Gudesen et al. | ............ 365/105 |
| 6,503,831 B2 | * | 1/2003 | Speakman | ................... 438/674 |

* cited by examiner

Primary Examiner—George Fourson
(74) Attorney, Agent, or Firm—Oliff & Berridge, PLC

(57) ABSTRACT

A technique for manufacturing memory devices which can easily manufacture ROM semiconductors having various write patterns at lower cost in a short period of time is disclosed. Since a simple matrix structure in which each memory cell is formed at a cross-point of an upper and a lower linear electrode is employed, and an insulating material is selectively ejected to surfaces of electrodes at predetermined memory cell positions by using an inkjet head, the surfaces of the electrode at the predetermined memory cell positions are covered with the insulating material. A state is stored in accordance with the presence or the absence of the covering insulating film on the surface of the electrode at each memory cell position.

5 Claims, 11 Drawing Sheets

[FIG. 1]
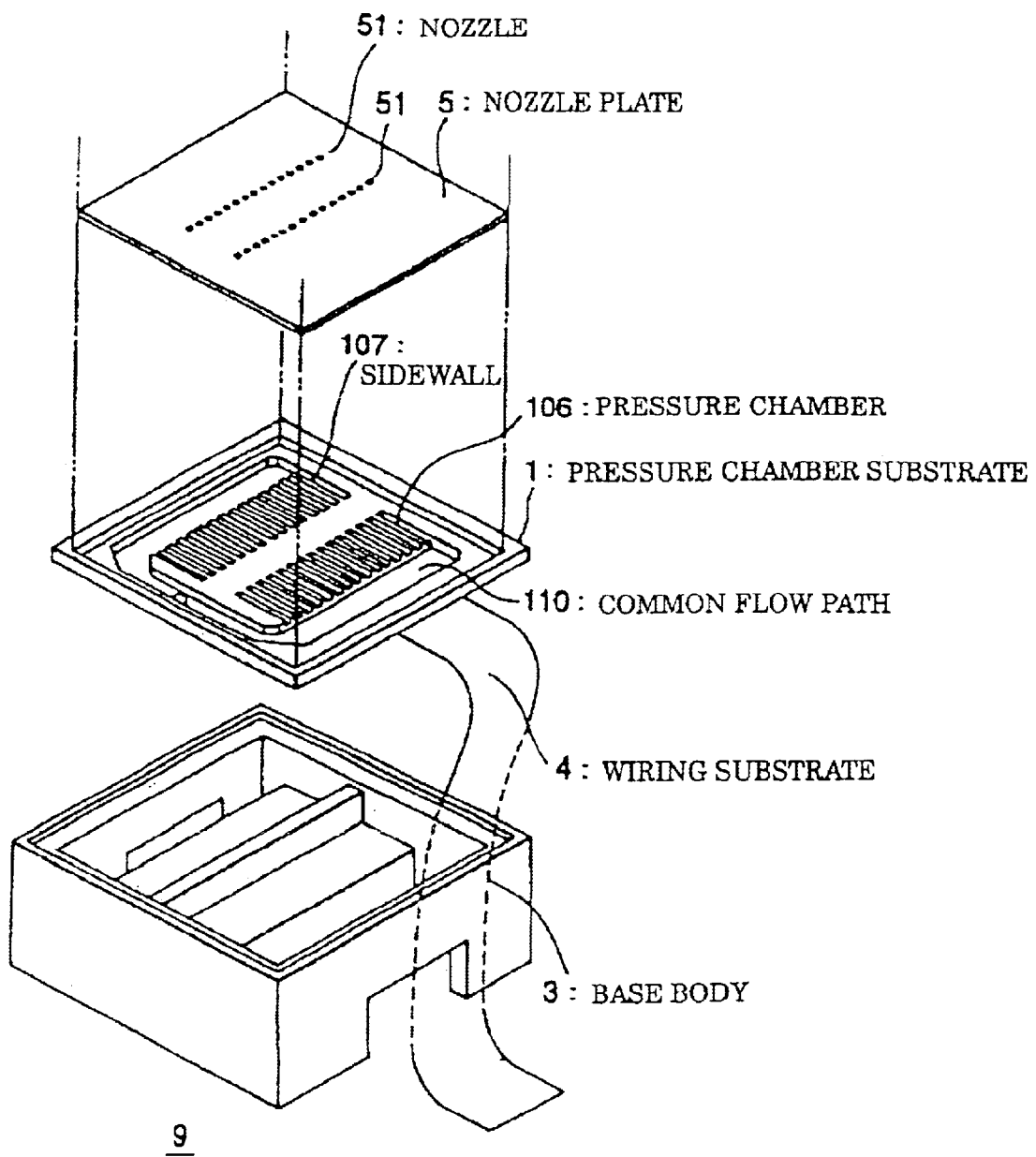

[FIG. 2]
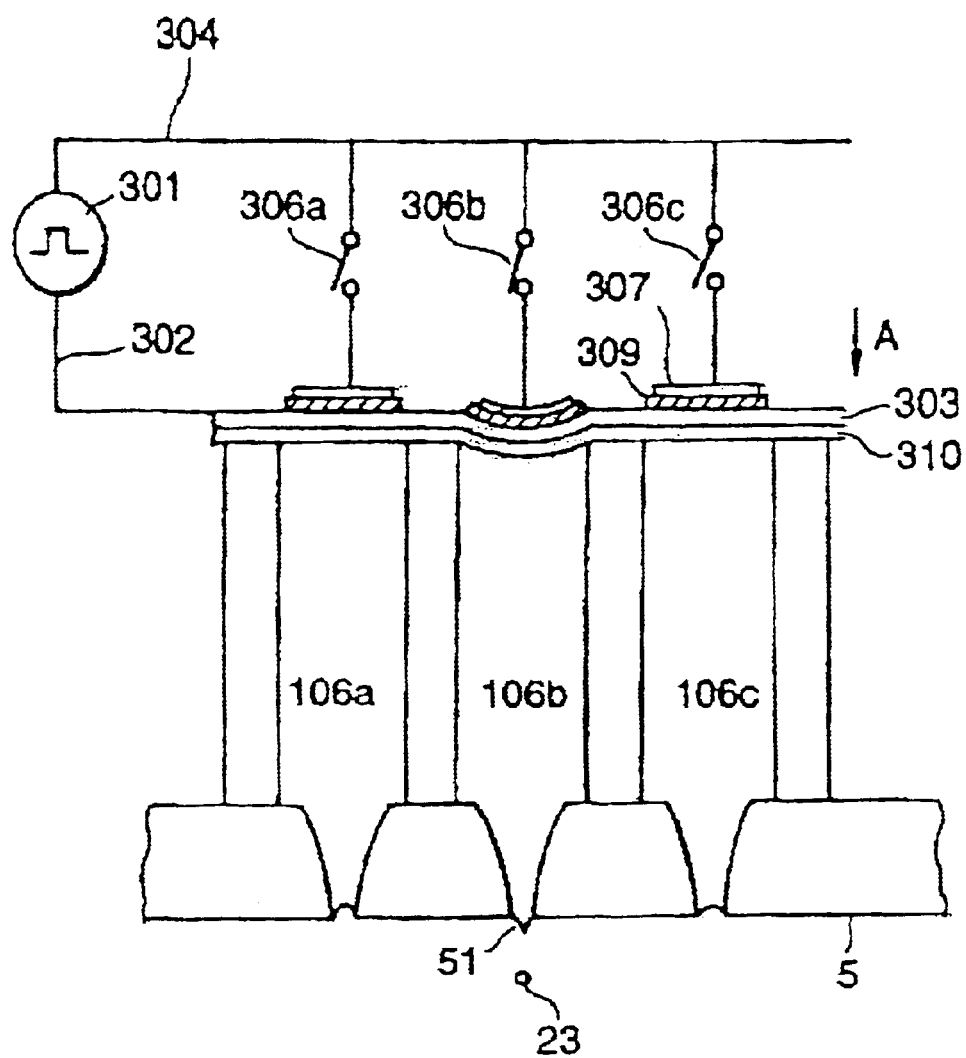

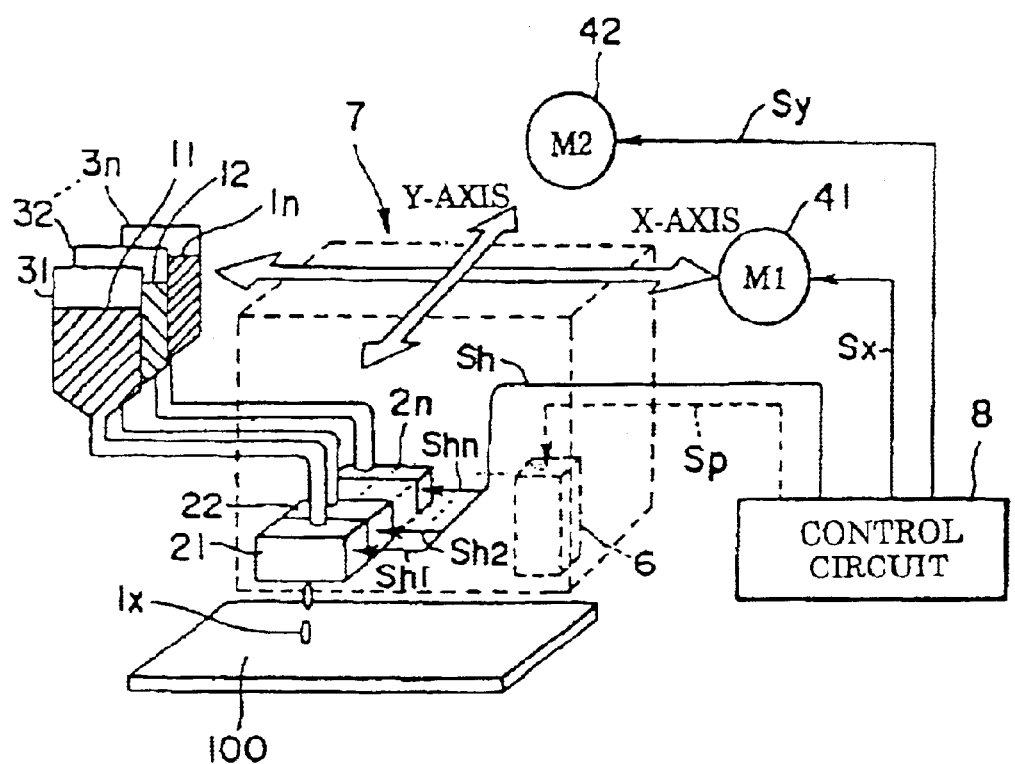
[FIG. 3]

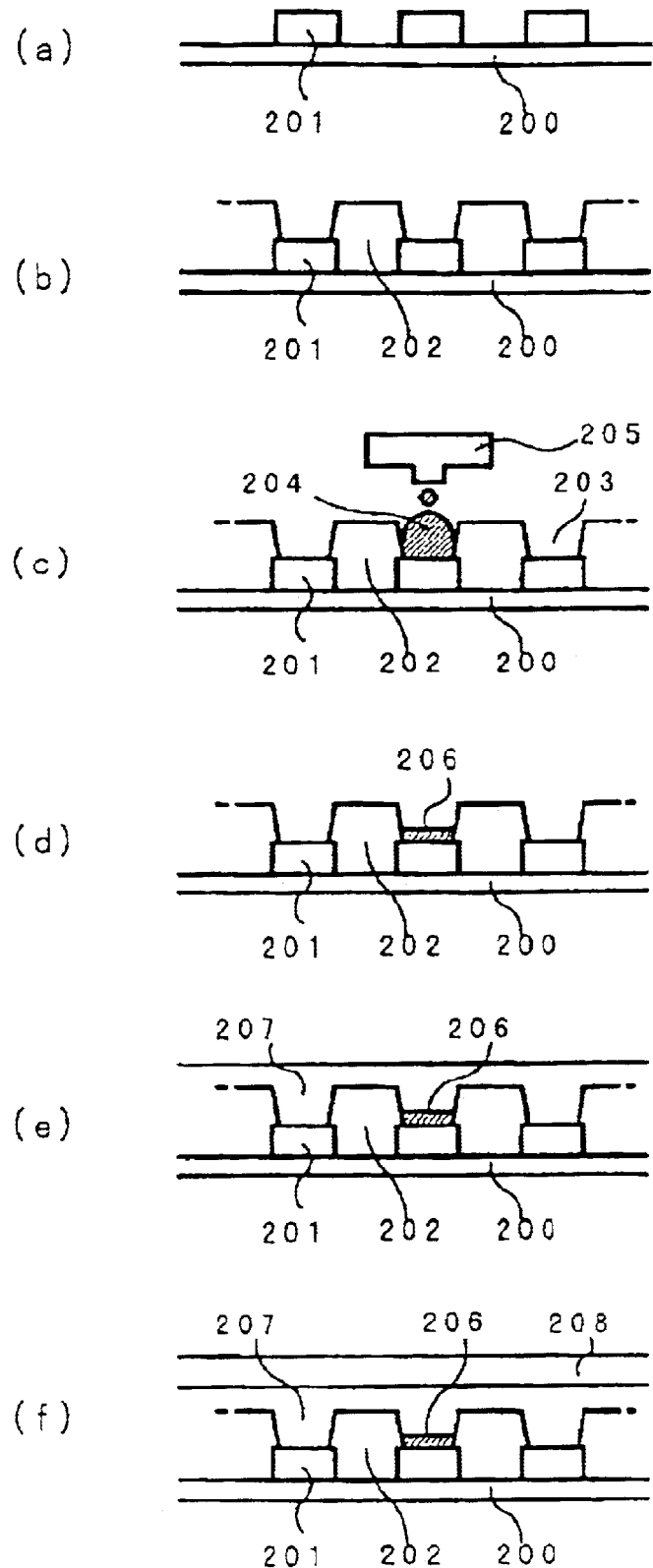

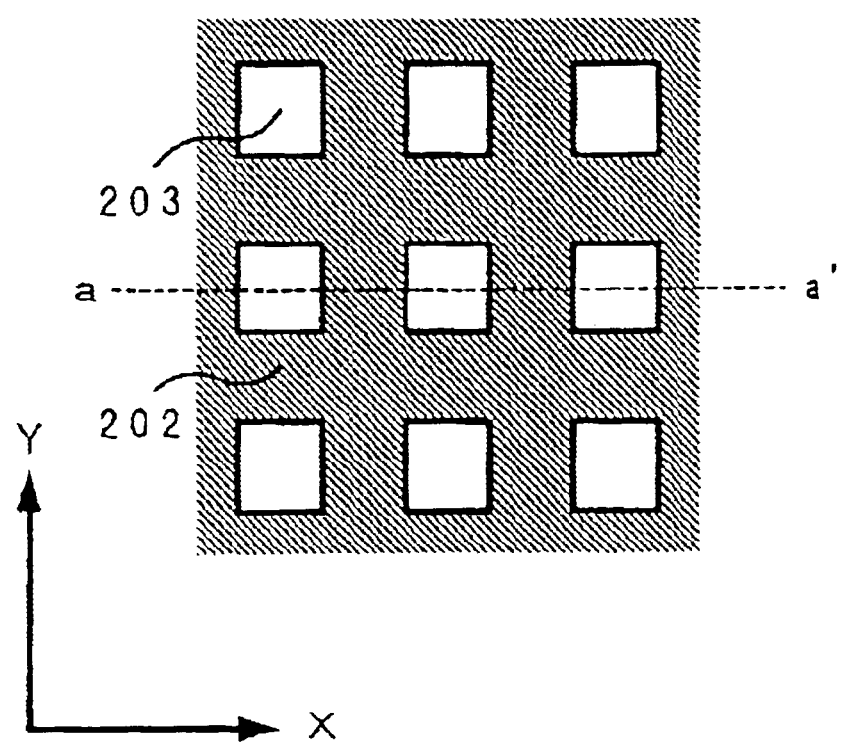

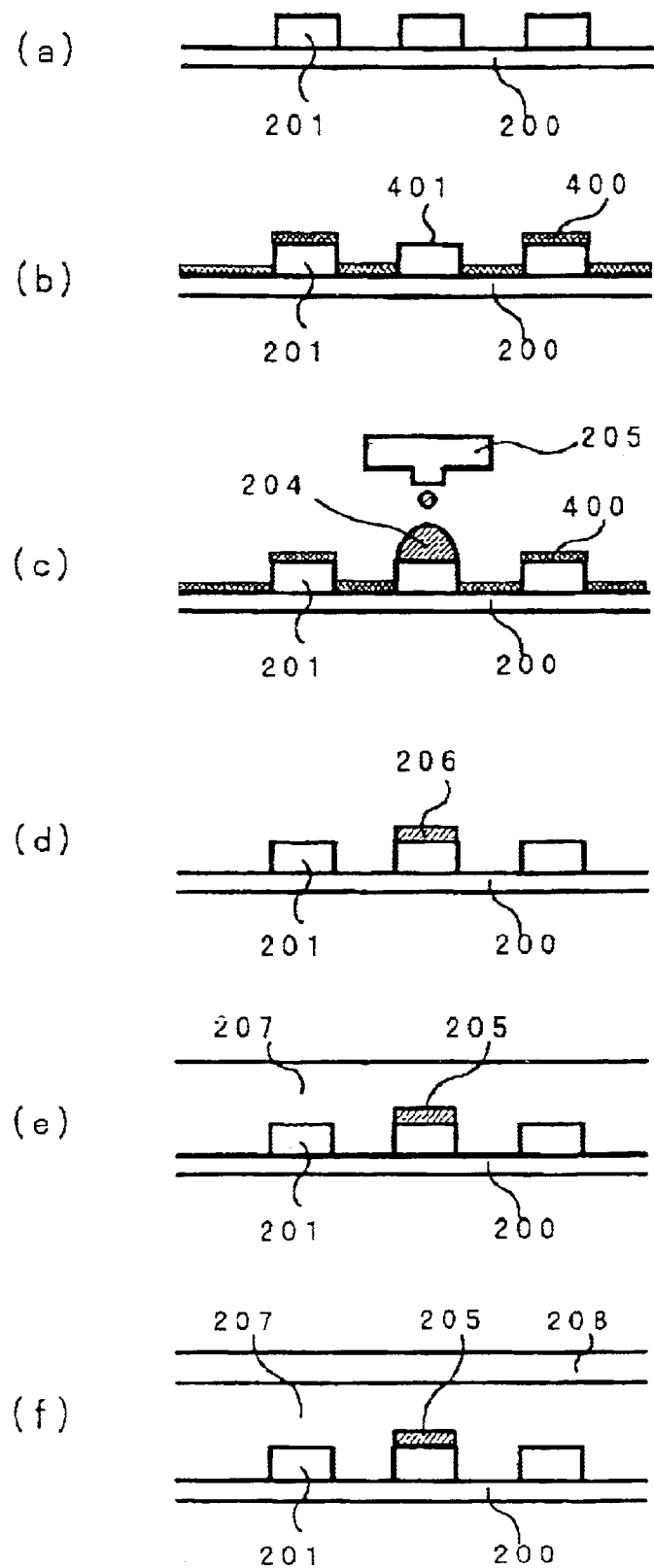
[FIG. 6]

[FIG. 7]
(a)
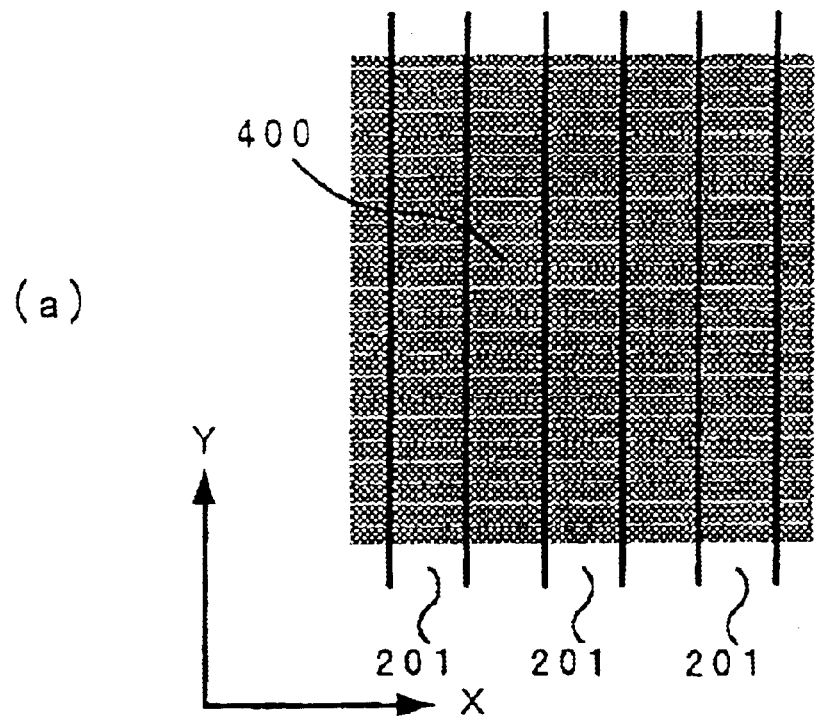
(b)
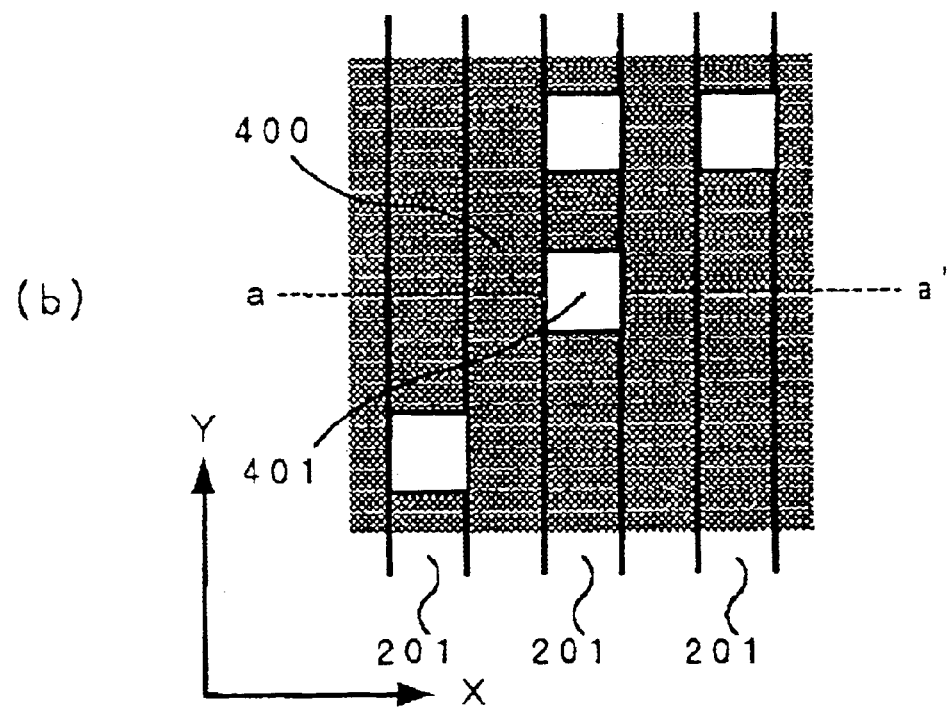

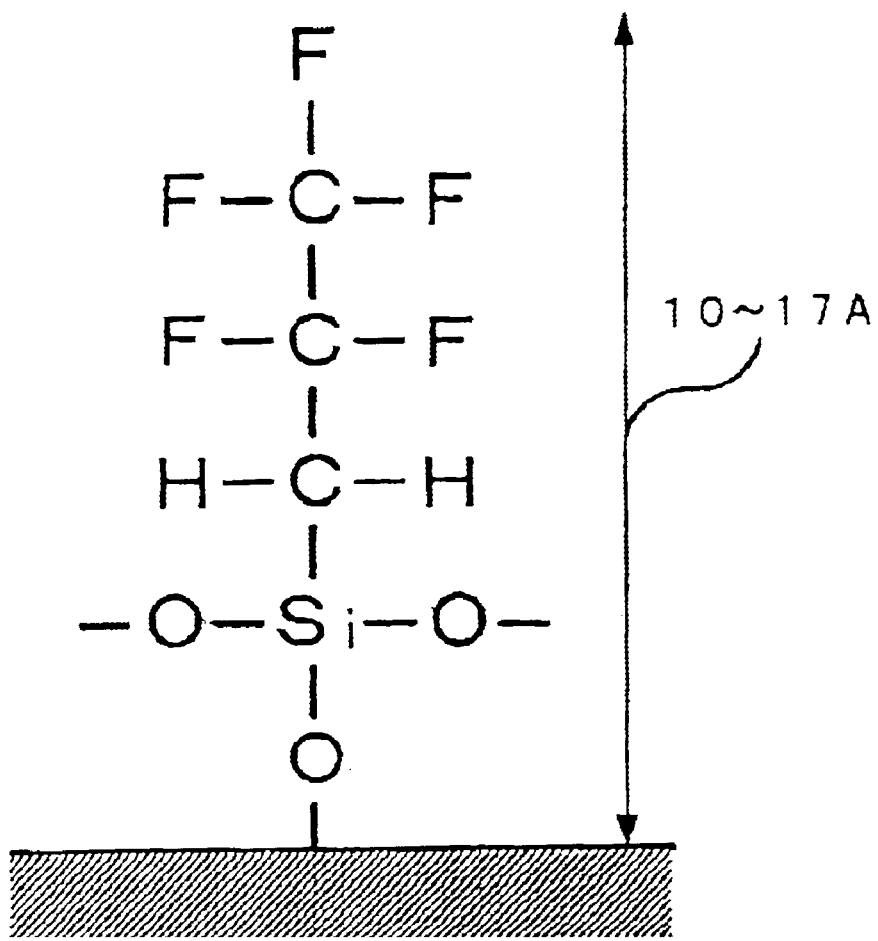
[FIG. 8]

[FIG. 9]
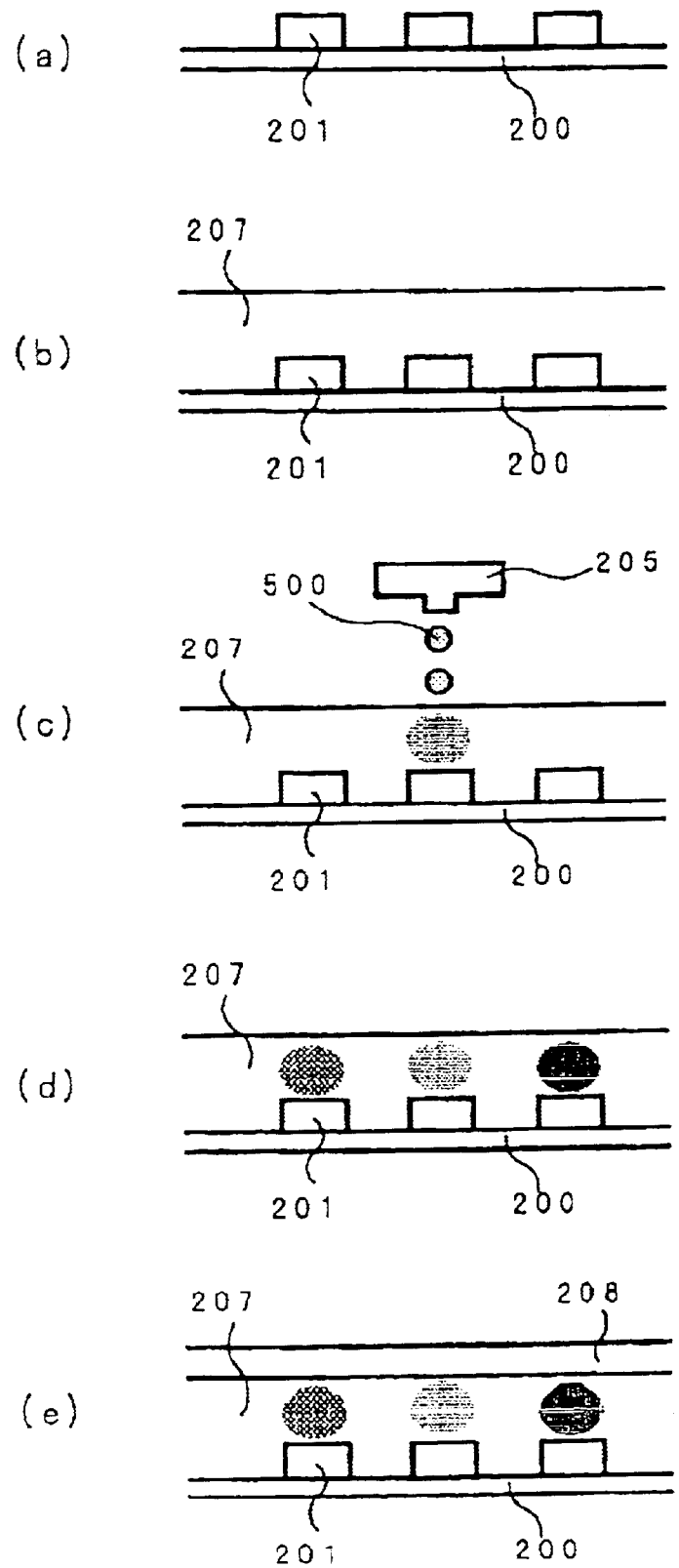

[FIG. 10]
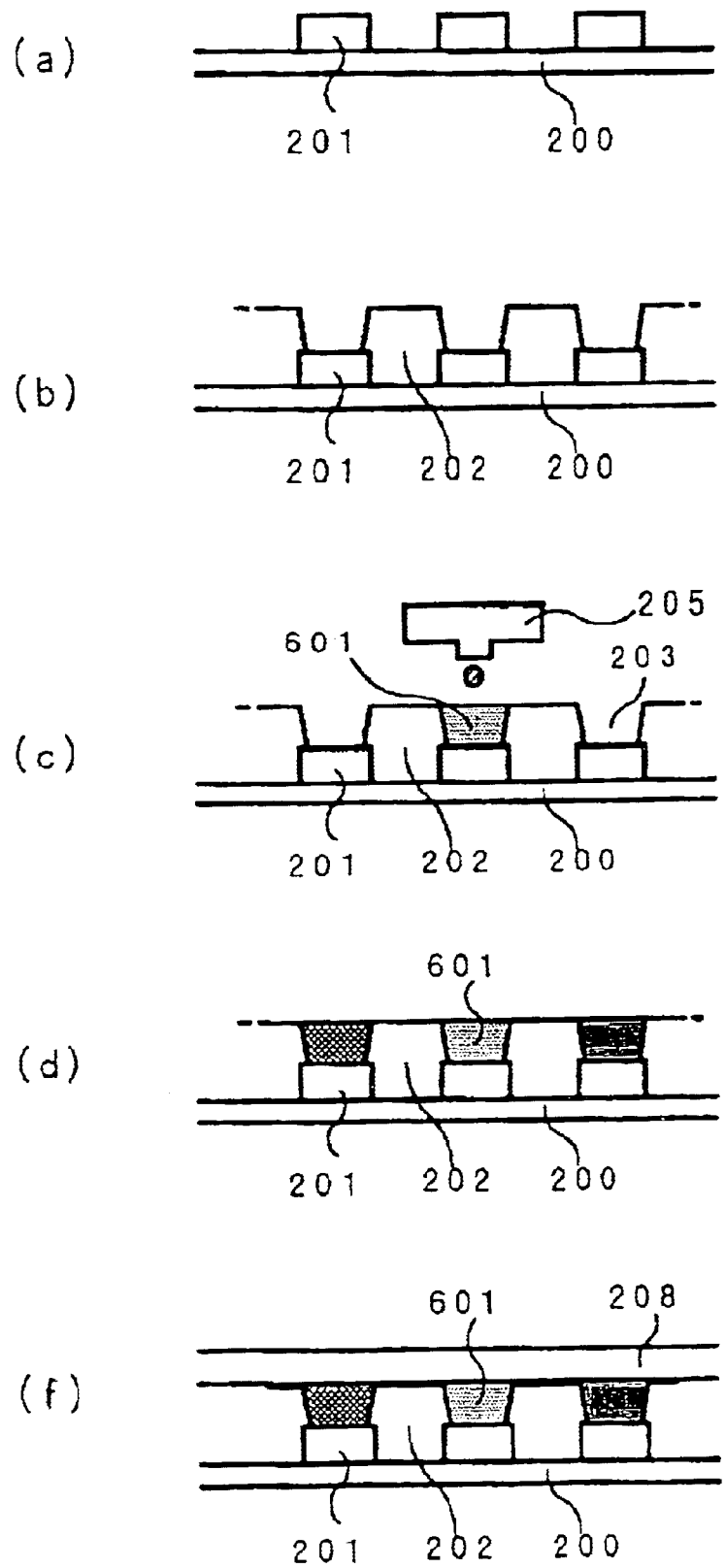

[FIG. 11]
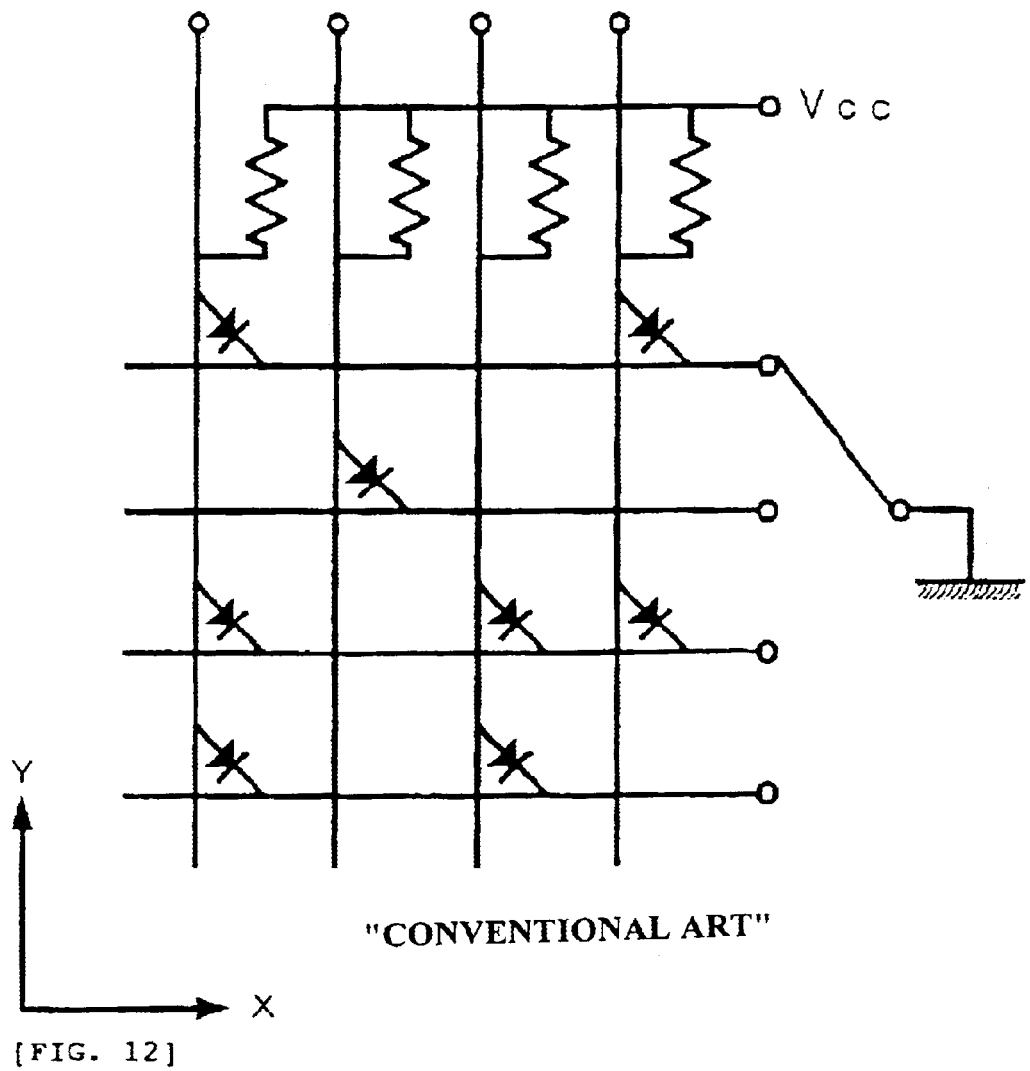
"CONVENTIONAL ART"
[FIG. 12]
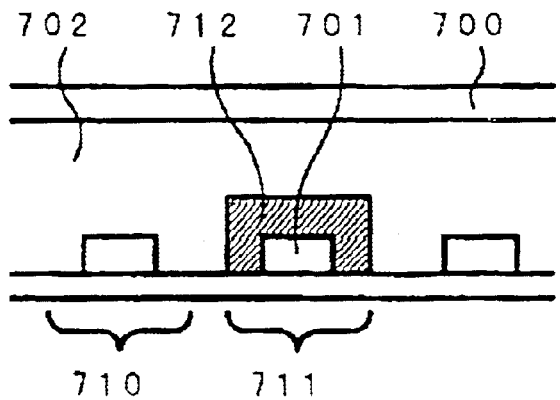
"CONVENTIONAL ART"

MEMORY DEVICE AND MANUFACTURING METHOD THEREFOR

BACKGROUND OF THE INVENTION

1. Field of Invention

The present invention relates to a memory device, and more particularly, relates to a ROM (a read only memory) semiconductor.

2. Description of Related Art

In general, the contents of ROM semiconductors are written, when memory devices are manufactured, as dormant patterns which cannot be rewritten by users. FIG. 11 shows an example of an equivalent circuit diagram of a conventional ROM semiconductor using diodes. In this diagram, memory cells are formed at cross-points of X-direction linear electrodes and Y-direction linear electrodes, i.e., a simple matrix structure is formed, and in this structure, a binary state is stored in each memory cell depending on whether an X-direction linear electrode and a Y-direction linear electrode are connected to each other by a diode.

A schematic cross-sectional view of a ROM semiconductor is shown in FIG. 12. An X-direction linear electrode 700 and a Y-direction linear electrode 701 are formed with a semiconductor layer 702 provided therebetween and are arranged so that a binary state is stored in accordance with the presence or the absence of an insulating film 712. For example, a memory cell 710 corresponds to a cell connected by a diode in FIG. 11, and a memory cell 711 corresponds to a cell not connected by a diode.

In a process for manufacturing conventional ROM semiconductors, a photomask is manufactured in accordance with a write pattern (a pattern written in ROM semiconductor), a photoresist layer is selectively exposed in conformity with the write pattern, and an insulating layer is then selectively etched, whereby a dormant pattern is written.

SUMMARY OF THE INVENTION

However, in conventional processes for writing a write pattern in a ROM semiconductor by using a photomask, problems described below have been encountered. The first problem is that since the cost of manufacturing photomasks is very high, for example, several millions to several tens of millions of Japanese Yen per mask, the price of the ROM semiconductor manufactured using photomasks is also very high. The second problem is that since a mask pattern of a photomask cannot be changed once the pattern is formed, a new photomask must be formed for each write pattern and, as a result, from a cost point of view, a write pattern cannot be easily changed. The third problem is that the sequential manufacturing process, which includes production of a photomask and etching of an insulating layer, takes approximately 2 to 3 weeks, and hence, manufacturing in a short period of time is difficult to accomplish.

The present invention was made in order to solve the conventional problems described above, and an object of the present invention is to provide a method for manufacturing a memory device, which can easily manufacture ROM semiconductors having various write patterns at lower cost in a short period of time.

A method for manufacturing a memory device of the present invention is a method for manufacturing a memory device which stores a state in accordance with the presence or the absence of a covering insulating film on the surface of an electrode at each memory cell position, wherein, by selectively ejecting the insulating material to the surfaces of electrodes at predetermined memory cell positions using an inkjet head, the surfaces of the electrodes at the predetermined memory cell positions are covered with the insulating material. Accordingly, by changing setting conditions for ink jetting, the memory content can be easily changed.

It is preferable that a step of forming a bank is provided so as to surround the surfaces of the electrodes at the memory cell positions, and that by selectively ejecting the insulating material to areas surrounded by the bank, the surfaces of the electrodes at the predetermined memory cell positions are covered with the insulating material. In this arrangement described above, due to the presence of the bank, the electrodes of the selected memory cells can be accurately coated with the covering insulating film.

In addition, a step is preferably provided of forming an area having non-affinity (high contact energy) for the insulating material relative to the surface of the electrode so as to surround the surfaces of the electrodes at the predetermined memory cell positions, and by selectively ejecting the insulating material to areas surrounded by the area having non-affinity, the surfaces of the electrodes at the predetermined memory cell positions are covered with the insulating material. The step of forming the area having non-affinity may be realized by a step of coating the surfaces of electrodes with FAS (fluorinated alkylsilane) and a step of removing the FAS by selectively irradiating UV light so as to form the areas surrounded by the area having non-affinity. In the arrangement described above, due to the presence of the area having non-affinity, the electrodes of the selected memory cells can be accurately coated with the covering insulating films.

A method for manufacturing a memory device according to the present invention is a method for manufacturing a memory device which stores states in accordance with resistances of semiconductor layers, wherein a doping material is injected into semiconductor layers at memory cell positions by using an inkjet head so that the resistance of each semiconductor layer is in one of a plurality of desired ranges preliminarily determined in accordance with n level states (n=2, or n>2). Accordingly, by changing setting conditions (changing ejection amount of a doping material and the like) for ink jetting, the memory content can be easily changed. In addition, since multiple level memory states can be formed by the difference in resistance of the semiconductor layers, various large-scale memory devices can be manufactured.

A step is preferably provided of forming a bank so as to surround the surfaces of electrodes at the memory cell positions and a step of ejecting a semiconductor material to areas surrounded by the bank using an inkjet head so as to form semiconductor layers at the memory cell positions. In this arrangement, due to the presence of the bank, the selected resistance of the electrode of each memory cell can be accurately controlled.

A method for manufacturing a memory device according to the present invention is a method for manufacturing a memory device which stores states in accordance with the resistances of semiconductor layers, including a step of forming a bank so as to surround the surfaces of electrodes at memory cell positions, a desired semiconductor material is selected in accordance with a state to be stored from among n types of semiconductor materials which are controlled so that the resistances thereof are in desired ranges preliminarily determined in accordance with n level states (n=2, or n>2), and the resistance of semiconductor layer of each memory cell is determined by selectively ejecting the selected semiconductor material using an inkjet head to an area surrounded by the bank. Accordingly, by selecting the semiconductor material ejected by ink jetting in accordance with the memory state to be written, the memory content of each memory cell can be easily determined. In addition, multiple level memory states can be formed by the difference in resistance of the semiconductor materials, and hence, various large-scale memory devices can be manufactured. Furthermore, due to the presence of the bank, the semiconductor material can be accurately ejected to the selected memory cell.

The method for manufacturing a memory device according to the present invention can form a memory device having a simple matrix structure in which each memory cell is formed at the cross-point of an upper and a lower linear electrode.

A memory device according to the present invention is a memory device which stores a state in accordance with the presence or the absence of a covering insulating film on the surface of an electrode at each memory cell position, wherein the covering insulating film is formed by selectively ejecting an insulating material using an inkjet head. Accordingly, by changing setting conditions for ink jetting, a memory device can be realized in which the memory content can be easily changed.

A bank is preferably provided which is formed so as to surround the surfaces of the electrodes at the memory cell positions and that the covering insulating films are formed in areas surrounded by the bank. In this structure, since the electrode of each memory cell is isolated from those of the other memory cells by the bank, a stable memory state can be realized.

In addition, it is preferable that the covering insulating films are formed by selectively ejecting the insulating material using the inkjet head to areas surrounded by an area having non-affinity for the insulating material relative to the surface of the electrode. In this structure, since the electrode of each memory cell is isolated from those of the other memory cells by the area having non-affinity, a stable memory state can be realized.

A memory device according to the present invention is a memory device which stores states in accordance with the resistances of semiconductor layers, wherein semiconductor layers at memory cell positions are each formed so that the resistance thereof is in one of a plurality of desired ranges preliminarily determined in accordance with n level states (n=2, or n>2) by injecting a doping material into the semiconductor layer using an inkjet head. Accordingly, by changing setting conditions (an ejection amount of the doping material) for ink jetting, a memory device can be realized which can easily change the memory content. In addition, since multiple level memory states can be formed due to the difference in resistance of semiconductor materials, various large-scale memory devices can be realized.

A bank is preferably provided which is formed so as to surround the surfaces of electrodes at the memory cell positions and that the semiconductor layers at the memory cell positions are formed by ejecting the semiconductor material using an inkjet head to areas surrounded by the bank. In this structure, since the electrode of each memory cell is isolated from those of the other memory cells by the bank, a stable memory state can be realized.

A memory device according to the present invention is a memory device which stores states in accordance with the resistances of semiconductor layers, which comprises a bank formed so as to surround the surfaces of electrodes at memory cell positions, wherein semiconductor layers at the memory cell positions are each formed by selectively ejecting one of n types of semiconductor materials, which are controlled so that the resistances thereof are in desired ranges preliminarily determined in accordance with n level states (n=2, or n>2), to areas surrounded by the bank using an inkjet head. Accordingly, by selecting a semiconductor material ejected from the inkjet head in accordance with a memory state to be written, the memory content of each memory cell can be easily determined. In addition, multiple level memory states can be formed due to the difference in resistance of the semiconductor materials, and various large-scale memory devices can be realized. Furthermore, since the electrode of each memory cell is isolated from those of the other memory cells by the bank, the stable memory state can be realized.

The memory device according to the present invention can be a memory device having a simple matrix structure.

BRIEF DESCRIPTION OF THE DRAWINGS

FIG. 1 is an exploded perspective view of an inkjet head for use in the present invention;

FIG. 2 is a view for explaining the principle of an inkjet head for use in the present invention;

FIG. 3 is a view for explaining the entire structure of an inkjet head apparatus for use in the present invention;

FIGS. 4(a)–4(f) are views showing manufacturing steps according to Example 1 of a first embodiment;

FIG. 5 is a view for explaining a bank formed in first embodiment;

FIGS. 6(a)–6(f) are views showing manufacturing steps according to Example 2 of the first embodiment;

FIGS. 7(a)–7(b) are views for explaining a non-affinity area formed in the first embodiment;

FIG. 8 is a view for explaining the structure of FAS;

FIGS. 9(a)–9(e) are views showing manufacturing steps in a second embodiment;

FIGS. 10(a)–10(f) are views showing manufacturing steps in a third embodiment;

FIG. 11 is a diagram of an equivalent circuit of a conventional ROM semiconductor using a diode; and FIG. 12 is a cross-sectional view of a conventional ROM semiconductor.

DETAILED DESCRIPTION OF PREFERRED EMBODIMENTS

Next, the embodiments of the memory devices according to the present invention and the manufacturing methods therefor will be described with reference to the figures.
(Structure and Principle of an Inkjet Head)

The structure and the principle of the inkjet head apparatus which is used when the memory device of the present invention is manufactured is described first.

FIG. 1 is an exploded perspective view showing an inkjet head 9 in which a path that supplies ink is formed in a pressure chamber substrate. As shown in FIG. 1, the inkjet head 9 primarily includes a pressure chamber substrate 1, a nozzle plate, and a base body 3.

The pressure chamber substrates 1 are formed on a substrate formed of single crystal silicon and are then separated from each other. The pressure chamber substrate 1 is provided with a plurality of strip-shaped pressure chambers 106, and each pressure chamber 106 is provided with a common flow path 110 for supplying the ink. The pressure chambers 106 are spaced from each other by sidewalls 107. The pressure chambers 106 are aligned in two lines, one hundred twenty eight of the pressure chambers are formed in each line, and hence, an inkjet head is realized having a printing density of two hundred fifty six nozzles. Vibration plates and piezoelectric thin-film elements are formed at the base body 3 side of the pressure chamber substrate 1. In addition, wirings from the individual piezoelectric thin-film elements are gathered at a wiring substrate 4, which is a flexible cable, and are then connected to an external circuit (not shown) of the base body 3. Ejection timing is indicated to the external circuit for ejecting a predetermined material to a semiconductor ROM, and the material is then ejected.

The nozzle plate 5 is joined to the pressure chamber substrate 1. Nozzles 51 for ejecting ink drops are formed in the nozzle plate 5 at locations corresponding to the pressure chambers 106. A nozzle 51 having, for example, a 28 $\mu$m diameter, may be formed, and in this case, the amount of the material ejected each time is approximately 10 pl to 20 pl. In addition, the nozzles 51 are aligned at predetermined intervals in two lines, and for example, the distance between the lines and the aligned pitch may be 141 and 75 $\mu$m, respectively.

The base body 3 is a rigid body formed of a plastic, a metal, or other material, and is used as a mounting table for the pressure chamber substrate 1.

In this connection the inkjet head can utilize a method using piezoelectric elements or a method in which ejection is performed by bubbles generated by heating.

FIG. 2 is a diagram for explaining the principle of the inkjet head 9. This figure shows the relationship of electrical connections with respect to the major portion of the inkjet head 9. One electrode of a drive voltage source 301 is connected to a lower electrode 303 of the inkjet head via a wiring 302. The other electrode of the drive voltage source 301 is connected to upper electrodes 307 corresponding to individual pressure chambers 106a to 106c via a wiring 304 and switches 306a to 306c.

In this figure, the switch 306b for the pressure chamber 106 is only closed, and the other switches 306a and 306c are open. The pressure chambers 106a and 106c connected to the switches 306a and 306c, which are open, are in waiting states for ejecting ink. When the material is ejected, for example, a switch is closed as is the switch 306b, and a voltage is applied to a piezoelectric film 309. The voltage has the same polarity as the polarizing direction of the piezoelectric film 309 shown by the arrow A, that is, the voltage has the polarity equivalent to that of a voltage applied when the piezoelectric film 309 is polarized. The piezoelectric film 309 expands in the thickness direction thereof and, at the same time, contracts in the direction perpendicular to the thickness direction. The stress generated by this contraction works on the interface of the piezoelectric film 309 and a vibration plate 310, and the piezoelectric film 309 and the vibration plate 310 are bended downwards. Due to this bending, the volume of the pressure chamber 106b is reduced, and a material drop 23 is ejected from a point indicated by 51. By using this material drop 23, an electrode is covered which corresponds to a memory cell. Subsequently, when the switch 306b is again opened, the piezoelectric film 309 and the vibration plate 310, which are bended, are recovered, and the volume of the pressure chamber 106b is increased, whereby the material is supplied to the pressure chamber 106b from an ink supply path (not shown). In this connection, the vibration frequency of the piezoelectric film 309 is 7.2 kHz.

In the method in which ejection is performed by bubble generation, a heating element is provided in a pressure chamber that communicates with a nozzle, and a fluid in the vicinity of the nozzle is boiled by heat generated from the heating element so as to form bubbles, whereby the fluid is ejected by the volume expansion thereof. The method using a piezoelectric element is preferable since no change in quality of the fluid occurs by heating.

FIG. 3 is a schematic view showing the entire structure of an inkjet head apparatus. In FIG. 3, the apparatus is provided with inkjet heads 21 to 2n (n is an optional integer), tanks 31 to 3n, a drive mechanism 7, and a control circuit 8. This inkjet head apparatus adheres a fluid drop 1x (x is one of 1 to n, and so on) formed of an insulating material or other material to a surface of an electrode at a memory cell position, whereby a predetermined insulating film or the like is formed.

The inkjet heads 21 to 2n have the same structure. Each head ejects a fluid containing an insulating material or other material by a method using a piezoelectric element.

The tanks 31 to 3n supply the fluid containing an insulating material or other material for forming insulating films to the inkjet heads 21 to 2n.

The drive mechanism 7 is provided with motors 41, 42 and mechanical units which are not shown. The motor 41 transfers an inkjet type recording head 2x in an X axis direction (lateral direction in FIG. 3) in accordance with a drive signal Sx, and the motor 42 transfers the inkjet type recording head 2x in a Y axis direction (depth direction in FIG. 3) in accordance with a drive signal Sy. The drive mechanism is not limited to this arrangement described above, and any mechanism may be used as long as the position of the inkjet head 2x can be relatively changed. Accordingly, a drive mechanism may be employed which transfers the substrate with respect to the inkjet head 2x.

The control circuit 8 is, for example, a computer and is provided with CPUs, memories, interfaces, and the like which are not shown. The control circuit 8 can control the apparatus to manufacture the memory devices of the present invention by implementing a predetermined program.

When the fluid drop 1x is ejected, ejection signals Sh1 to Shn are sent to one of the inkjet heads 21 to 2n, and when the head is transferred, the drive signals Sx, Sy are sent to the motors 41, 42.

In this connection, in the case in which a predetermined treatment for an atmosphere is required when the fluid drop 1x is ejected from the inkjet head 2x, a solidification apparatus 6 may be additionally provided. In order to promote crystallization of the insulating layer, the solidification apparatus 6 performs a physical, a physicochemical, or a chemical treatment on a surface used as an underlying layer for the fluid drop 1x with respect to a control signal Sp sent from the control circuit 8. For example, the treatment can be a forced hot airstream, laser irradiation, a heating/drying treatment by irradiation using a lamp, a chemical treatment using a chemical material, a predetermined treatment of surface improvement for controlling a degree of adhesion of the fluid drop 1x to the surface used as an underlying layer therefor, or the like.

When the memory device of the present invention is manufactured, by using the inkjet head apparatus described above, an insulating material or the like can be selectively ejected to predetermined memory cells in accordance with a write pattern stored in the inkjet head apparatus.

[First Embodiment]

A first embodiment of the present invention relates to a method for manufacturing a memory device, in which surfaces of electrodes at predetermined memory cell positions are covered with an insulating material by selectively ejecting the insulating material using an inkjet head.

EXAMPLE 1

Cross-sectional views of manufacturing steps of Example 1 according to this embodiment are shown in FIGS. 4(a)–4(f). In this example, a step is provided of forming a bank so as to surround the surface of electrodes at memory cell positions.

Step of Lower Electrode Formation (FIG. 4(a)): A lower electrode layer is formed on a substrate 200. The substrate 200 may be formed of a silicon wafer, a quartz glass, a soda glass, or a heat-resistant glass, such as Corning 7059, or Nippon Electric Glass OA-2. The lower electrode layer can be obtained by forming a platinum film using a direct current sputtering process, an electron beam evaporation process, or other process. Besides platinum, the electrode may preferably be formed of a noble metal, such as palladium, or a conductive compound, such as $IrO_2$, $RuO_2$, or $ReO_3$.

After the lower electrode layer is formed, a resist (not shown) is applied, patterning is performed linearly, and dry etching is then performed by using the pattern thus formed as a mask. In the step described above, a plurality of linear lower electrodes 201 is formed. In the figure, the linear pattern is formed in the direction from the front to the back.

Step of Bank Formation (FIG. 4(b)): A bank 202 is formed on the lower electrode 201 and on the substrate 200. The bank 202 serves as a partition member, and may be formed of, for example, an insulating material, such as a polyimide, or SiO2. For the formation of the bank 202, an optional process, such as a lithographic process or a printing process, may be selected. When a lithographic process is used, the insulating material is applied so that the height thereof is equivalent to that of the bank by using a predetermined process, such as spin coating, spray coating, roll coating, die coating, or dip coating, and subsequently, a resist layer is applied to the layer formed of the insulating material. Next, the resist layer is removed, except for a resist layer having a shape suitable for forming the bank. Finally, the material used for forming the bank is removed by etching, except for a material located under masks. When a printing process is used, the insulating material is applied so as to directly form a bank shape by using an optional process, such as intaglio printing, surface printing, or relief printing. The bank 202 is formed to have an approximate level of height so as not to overflow the insulating material to an adjacent recess 203 due to the surface tension thereof when the insulating material is filled in a recess 203 surrounded by the bank. For example, when an insulating film 0.05 to 0.2 μm thick is formed for covering the surface of the electrode, the bank 202 is formed to have a height of approximately 0.2 to 2 μm.

A plan view of the bank 202 is shown in FIG. 5. The bank 202 is formed in a lattice shape in two directions, i.e., a Y direction (the same direction as that of the lower electrode 201) and an X direction. An area 203 (corresponding to the recess 203 in FIG. 4(b)) surrounded by the bank 202 corresponds to the memory cell position. That is, the bank 202 is formed so as to surround the surface of the lower electrode 201 at the memory cell position. FIG. 4(b) corresponds to the cross-sectional view taken along the line a-a' in FIG. 5.

Step of Inkjet Ejection (FIG. 4(c), (d)): An insulating material, such as SiO2, is selectively ejected from an inkjet head 205 in accordance with a write pattern, and an insulating material 204 is filled in the recess 203 surrounded by the bank 202, whereby an insulating film 206 is formed. The insulating material 204 is ejected from the inkjet head 205 to the recess 203 surrounded by the bank 202 (FIG. 4(c)). An ejection amount of the insulating material 204 is controlled to obtain a predetermined thickness when the volume of the insulating material 204 is decreased by heat treatment. After the insulating material 204 is filled, a solvent component is vaporized by performing a heat treatment. By vaporizing the solvent component, the volume of the insulating material 204 is decreased, and the insulating film 206 is then formed (FIG. 4(d)). The ejection amount of the insulating material 204 is controlled so that the thickness of the insulating film 206 thus formed is, for example, approximately 0.1 to 2 μm.

Step of Semiconductor Layer Formation (FIG. 4(e)): A semiconductor layer 207 is formed on the lower electrode 201, the bank 202, and the insulating film 206. The semiconductor layer 207 may be formed of a conventional semiconductor material, and the composition thereof may be optionally selected.

When a sol-gel process is used for film formation, a hydrated complex of a metal hydroxide having a metal component capable of forming a semiconductor layer, i.e., a sol, is applied to the lower electrode 201 and the like, is dried, and is degreased, whereby precursors for the semiconductor layer are formed. The precursors are then crystallized by an RTA treatment, thereby yielding a thin-film semiconductor. Subsequently, application, drying, and degreasing are repeated desired times so as to form a film having a finished thickness of 0.3 μm.

In addition to a sol-gel process, a semiconductor layer may be formed by a high frequency sputtering process, a metal organic decomposition process (an MOD process), a printing process, or other process. A printing process is a technique for forming a semiconductor film, in which a film is formed by applying a paste or a slurry, primarily formed of electrostrictive ceramic particles, to a substrate, and by a subsequent heat treatment. When this printing process is employed, a lithographic technique, or a mechanical processing technique, such as laser processing, or slicing, is easily used, and hence, a shape of the semiconductor layer can be optionally designed. In addition, since a degree of designing freedom is improved, integration density of capacitor used in memory devices can be improved.

Step of Upper Electrode Formation (FIG. 4(f)): An upper electrode layer can be obtained by forming a film formed of platinum using a direct current sputtering process, an electron beam evaporation process, or other process. In addition to platinum, an electrode is preferably formed of Al, Cu, Ca, Mg, Li, a noble metal, such as palladium, and a conductive compound, such as IrO2, RuO2, and ReO3.

After the upper electrode layer is formed, a resist (not shown) is applied thereto, patterning is linearly performed in the direction perpendicular to the lower electrode 201 (X direction), and dry etching or other process is then performed by using the patterned resist thus formed as a mask. In the step described above, a plurality of upper electrodes 208 is formed in the direction perpendicular to the lower electrodes 201.

In addition, the upper electrode 208 can be patterned by an inkjet process using a conductive polymer. As described above, similarly to the insulating layer or the like, the upper electrode pattern can be optionally and appropriately formed.

The memory device of the present invention manufactured by the steps described above has a simple matrix structure in which memory cells are formed at the crosspoints of the linear upper and the linear lower electrodes. Since the covering insulating film, which determines a memory content stored in a memory cell, is formed by ejecting the insulating material from the inkjet head, an expensive photomask is not required, and the memory device can be manufactured and realized at a lower cost.

In addition, by controlling the operation of the inkjet head, since a memory cell covered with the covering insulating film can be changed, a write pattern in the memory device can be easily changed. As a result, memory devices having various write patterns therein can be manufactured and can be realized.

Furthermore, when an inkjet head is used, the covering insulating film can be formed by a compact apparatus, such as a printer for home use, and hence, the memory device can be manufactured at a place (for example, typical offices, counters, or the like) at which a large apparatus cannot be installed. For example, it is possible that information that is specific to each customer can be written in a credit card, a debit card, a prepaid card, or other device at a counter in a bank or the like by using an inkjet head.

In addition, when the insulating material is ejected from the inkjet head, since each memory cell is isolated from the others by the bank, the insulating material can be more selectively ejected to memory cells, and hence, writing accuracy can be improved.

EXAMPLE 2

Cross-sectional views of manufacturing steps of Example 2 according to this embodiment are shown in FIGS. 6(a)-6(f). In this example, as is the case with Example 1, the following steps are provided: a step of lower electrode formation, a step of inkjet ejection, a step of semiconductor layer formation, and a step of upper electrode formation. In addition, a step (a step of surface treatment) is provided in which an area is formed having non-affinity for an insulating material so as to surround the surfaces of electrodes at memory cell positions.

Since the step of lower electrode formation (FIG. 6(a)), the step of semiconductor layer formation (FIG. 6(e)), and the step of upper electrode formation (FIG. 6(f)) are equivalent to those in Example 1, descriptions therefor are omitted. The step of surface treatment (FIG. 6(b)) is performed after the step of lower electrode formation and before the step of inkjet ejection.

Step of Surface Treatment (FIG. 6(b)): A non-affinity area (an FAS area) 400 is formed on lower electrodes 201. In particular, a step of FAS coating and a step of selective FAS removal are performed. In FIGS. 7(a) and 7(b), a shadow area is an area coated with FAS.

Step of FAS Coating (FIG. 7(a)): FAS (fluorinated alkylsilane) is deposited on the surfaces of the lower electrodes 201 by a CVD process or other process. FAS is a hydrophobic material and has characteristics of easily bonding to a hydroxyl group. In general, since the surface of the lower electrode 201 is in the oxidized state and has hydroxyl groups thereon, by disposing the lower electrode 201 in an atmosphere of FAS vapor, FAS bonds to the hydroxyl groups on the surface of the lower electrode 201. As a result, a monomolecular layer formed of the FAS having a thickness of 10 to 17 Å is formed on the surface of the lower electrode 201, and hence, the surface of the lower electrode 201 becomes hydrophobic. In FIG. 8, the molecular structure of the FAS in the bonding state is shown. In this connection, areas of the substrate at which the lower electrodes 201 are not formed thereon are also coated with FAS.

Step of Selective FAS Removal (FIG. 7(b)): FAS is removed by selectively irradiating UV (ultraviolet) light to the surface of the lower electrode 201 coated with FAS. In this step, areas at which UV light is irradiated are areas corresponding to the memory cells at which an insulating material is ejected in a subsequent step of inkjet ejection. In an area 401 formed by removing FAS using UV light irradiation, since the surface of the lower electrode 201 having hydroxyl groups is exposed, the hydrophilic characteristic is regained, and hence, the surface of the lower electrode has affinity for the insulating material. FIG. 6(b) is a cross-sectional view taken along the line a-a' in FIG. 7(b).

Step of Inkjet Ejection (FIG. 6(c), (d)): By selectively ejecting an insulating material, such as SiO2 (polycrystalline silicon), from an inkjet head in accordance with a write pattern, a covering insulating film is formed in the area 401 surrounded by the FAS area 400. An insulating material 204 is ejected from an inkjet head 205 to the area 401 surrounded by the FAS area 400. Since the FAS area 400 has non-affinity, and the area 401 has affinity, the insulating material 204 stays in a mounded state in the area 401 (FIG. 6(c)). The ejection amount of the insulating material 204 is controlled so that a desired thickness (approximately 0.1 to 2 $\mu$m) thereof is formed when the volume of the insulating material is decreased by heat treatment. After covering insulating films 206 are formed in necessary areas, the entire FAS is removed by UV irradiation or the like (FIG. 6(d)).

The memory device of the present invention manufactured by the steps described above has the same advantages as those obtained in Example 1.

In addition, when the insulating material is ejected from the inkjet head, since the non-affinity area is formed instead of the bank in Example 1, and the individual memory cells are isolated from each other by the non-affinity area, the insulating material can be more selectively ejected to memory cells, and the writing accuracy can be improved.

[Second Embodiment]

A second embodiment of the present invention relates to a method for manufacturing a memory device, in which multiple level memory states can be realized by injecting a doping material into semiconductor layers at memory cell positions by using an inkjet head so that the resistances of the semiconductor layers are each in one of a plurality of desired ranges preliminarily determined in accordance with n level memory states (n=2, or n>2).

Cross-sectional views of manufacturing steps of this embodiment are shown in FIGS. 9(a)–9(e). In this embodiment, as is the case with first embodiment, the following steps are provided: a step of lower electrode formation, a step of semiconductor layer formation, a step of inkjet ejection, and a step of upper electrode formation. However, this embodiment differs from first embodiment, in that, after the step of lower electrode formation, the step of semiconductor layer formation is performed, and the step of inkjet ejection is subsequently performed.

In this embodiment, a step of forming a bank so as to surround surfaces of electrodes at memory cell positions, or a step (a step of surface treatment) of forming an area having non-affinity for an insulating material so as to surround the surfaces of the electrodes at the memory cell positions may be provided. When the step of forming the bank is provided, the step can be realized in a manner equivalent to that in Example 1 of first embodiment, and when the step of surface treatment is provided, the step can be realized in a manner equivalent to that in Example 2 of the first embodiment.

Since the step of lower electrode formation (FIG. 9(a)), the step of semiconductor layer formation (FIG. 9(b)), and the step of upper electrode formation (FIG. 9(e)) are equivalent to those in Example 1, descriptions therefor are omitted.

Step of Inkjet Ejection (FIG. 9(c), (d)): By selectively ejecting a doping material 500 from an inkjet head in accordance with a write pattern, the doping material is injected into semiconductor layers at memory cell positions corresponding to the write pattern. The doping material may be formed of boron (B) when the semiconductor layer is a p-type, and when the semiconductor layer is an n-type, it may be formed of phosphorus (P), arsenic (As), antimony (Sb), or other material.

Since the conductivity (resistance) of the semiconductor layer varies in accordance with an amount (concentration) of the doping material, by controlling the amount and the concentration of a doping material to be injected, the conductivity of the semiconductor layer at each memory cell can be different from the others.

Accordingly, the values of the conductivity are classified into n ranges (n=2, or n>2), and each range is arranged to correspond to a memory state different from the others. Next, the amount or the concentration of the doping material injected into the semiconductor layer of each memory cell position is controlled so that the conductivity of the semiconductor layer at each memory cell is in a range in accordance with a memory state to be stored. Accordingly, the n-level memory state can be stored in each memory cell.

In the step described above, by finely classifying the conductivity, a memory device having a desired multilevel can theoretically be realized. However, in consideration of stable reading operation or the like, it is practically preferable that a degree of classification is reasonably determined. In accordance with a reasonable classification method, it may be considered that conductivities having the same digit are included in one range and that this range is made to correspond to a memory state different from the others.

For example, in the case in which the conductivity of a semiconductor layer containing little or no doping material is assumed to be $10^6$, when a doping materials is injected thereinto, the conductivity can be made to be $10^5$, $10^4$, $10^3$, $10^2$, and $10^1$. In this case, when the conductivities of $10^6$, $10^5$, $10^4$, $10^3$, $10^2$, and $10^1$ are arranged to correspond to six memory states, a six-level state can be stored in each memory cell. In the case described above, a six-level state is discussed as an example; however, the number of levels may be determined in accordance with designing.

The memory device of the present invention manufactured by the steps described above has a simple matrix structure in which memory cells are formed at the crosspoints of linear upper and linear lower electrodes. Since the conductivity of the semiconductor layer, which determines a memory content in a memory cell, can be determined by ejecting the doping material from the inkjet head, an expensive photomask is not required to be used, and the memory device can be manufactured and realized at a lower cost.

In addition, by controlling operation of the inkjet head, that is, by controlling the amount of the doping material, the concentration thereof, or the like, the write pattern can be easily changed, and multiple level memory states can be realized in each memory cell. As a result, various large-scale memory devices can be manufactured and can be realized.

Furthermore, when an inkjet head is used, the doping material can be ejected by a compact apparatus, such as a printer for home use, and hence, the memory device can be manufactured at a place (for example, a typical office, a counter, or the like) at which a large apparatus cannot be installed. For example, it is possible that information that is specific to each customer can be written in a credit card, a debit card, a prepaid card, or other device at a counter in a bank or the like by using an inkjet head.

[Third Embodiment]

A third embodiment of the present invention relates to a method for manufacturing a memory device, in which a predetermined semiconductor material is selected in accordance with a state to be stored from among n types of semiconductor materials which are controlled so that the resistances thereof are in predetermined ranges in accordance with n level states (n=2, or n>2), and the selected semiconductor material is selectively ejected to an area surrounded by the bank by using an inkjet head, whereby the resistance of the semiconductor layer of each memory cell is determined.

Cross-sectional views of manufacturing steps of this embodiment are shown in FIGS. 10(a)–10(f). In this embodiment, the following steps are provided: a step of lower electrode formation, a step of bank formation, a step of inkjet ejection, and a step of upper electrode formation.

In this embodiment, instead of the step of bank formation, a step (a step of surface treatment) of forming an area having non-affinity for an insulating material so as to surround surfaces of electrodes at memory cell positions may be provided. When the step of surface treatment is provided, the step can be realized in a manner equivalent to that in Example 2 of the first embodiment.

Since the step of lower electrode formation (FIG. 10(a)), the step of bank formation (FIG. 10(b)), and the step of upper electrode formation (FIG. 10(e)) are equivalent to those in Example 1 of first embodiment, descriptions therefor are omitted.

Step of Inkjet Ejection (FIG. 10(c), (d)): A memory cell position is selected in accordance with a write pattern, a semiconductor material 601 is selected based on a state to be stored in the selected memory cell, and the semiconductor material thus selected is ejected to a recess 203 surrounded by a bank 202 at the selected memory cell position, whereby the semiconductor layer 601 is formed.

In the steps described above, the semiconductor material is selected from among a plurality of semiconductor materials which are each preliminarily controlled so that an amount (concentration) of a doping material contained therein differs from the others. In the plurality of semiconductor materials, the amount of the doping material is controlled so that the conductivity of each semiconductor layer to be formed has a different digit from the others.

Accordingly, since the semiconductor material is selected for each memory cell in accordance with the memory state therefor, the digit of the conductivity of the semiconductor layer to be formed in each memory cell can be made to correspond to the memory state. The relationships of the digit of conductivity, the range thereof, and the memory state are determined in a manner equivalent to, for example, that in the second embodiment.

The memory device of the present invention manufactured by the steps described above has a simple matrix structure in which memory cells are formed at the crosspoints of linear upper and the linear lower electrodes. Since the conductivity of the semiconductor layer, which determines a memory content stored in a memory cell, can be determined by a type of semiconductor material ejected from the inkjet head, an expensive photomask is not required to use, and the memory device can be manufactured and realized at a lower cost.

In addition, by controlling operation of the inkjet head, that is, by changing a pattern for selecting a semiconductor material to be ejected, the write pattern can be easily changed, and multiple level memory states can be realized in each memory cell. As a result, various large-scale memory devices can be manufactured and can be realized.

Furthermore, when an inkjet head is used, the semiconductor material can be ejected by a compact apparatus, such as a printer for home use, and hence, the memory device can be manufactured at a place (for example, a typical office, a counter, or the like) at which a large apparatus cannot be installed. For example, it is possible that information that is specific to each customer can be stored in a credit card, a debit card, a prepaid card, or other device at a counter in a bank or the like by using an inkjet head.

(Modified Example)

The memory devices manufactured according to the present invention can be applied to every information processing apparatus provided with memory functions, such as internal memory devices for computers, memory sticks, and memory cards.

The present invention is not limited to the embodiments described above, and various modification of the present invention can also be used. For example, when the memory device of the present invention has a laminated structure, an even larger-scale memory device can be formed.

In addition, in Embodiments 1 and 2, film formation of the semiconductor layer performed by a sol-gel process or the like is described; however, the semiconductor layer may also be formed by ejecting a semiconductor material from an inkjet head.

[Advantages]

According to the present invention, since the memory contents of ROM semiconductors can be determined by ejecting an insulating material, a doping material, a semiconductor material, or other material from and inkjet head, ROM semiconductors having various memory patterns can be easily manufactured at a lower cost in a short period of time.

What is claimed is:

1. A method for manufacturing a memory device which has memory cells formed at cross points of lower electrodes and upper electrodes, comprising:

forming the lower electrodes on a substrate;

forming a bank which surrounds side surfaces of the lower electrodes at each of the memory cells, the bank having a certain height to prevent an insulating material from overflowing into adjacent recesses which are constituted of areas surrounded by the bank;

ejecting an insulating material to a top surface of the lower electrodes using an inkjet head;

removing a solvent component of the insulating material to form an insulating film having a predetermined thickness;

forming a semiconductor layer over the lower electrodes, over the bank and over the insulating film;

forming the upper electrodes on the semiconductor layer.

2. A method for manufacturing a memory device which has memory cells formed at cross points of lower electrodes and upper electrodes, comprising:

forming the lower electrodes on a substrate;

forming a layer which surrounds at least one surface of the lower electrode at each of the memory cell positions;

ejecting insulating material to the surface which is surrounded by the layer; removing a solvent component of the insulating material to form an insulating film;

forming a semiconductor layer over the lower electrodes, over the layer and over the insulating film; and forming the upper electrodes on the semiconductor layer, wherein forming the layer further comprises;

coating a surface of each of the electrodes and a surface of the substrate with a FAS (fluorinated alkylsilane); and removing the FAS which is formed on at least one surface of the lower electrode at each of the memory cell positions by irradiating UV light.

3. The method for manufacturing a memory device according to claim 2, wherein forming the layer further comprises:

depositing a FAS on a surface of each of the electrodes and a surface of the substrate; and removing the FAS which is formed on at least one surface of the lower electrode at each of the memory cell positions by irradiating UV light.

4. A method for manufacturing a memory device according to claim 3, wherein depositing the FAS comprises:

depositing the FAS by a CVD process.

5. A method for manufacturing a memory device according to claim 1, wherein an ejection amount of insulating material is controlled so that a thickness of the insulating film is about 0.1 to 0.2 $\mu$m.

* * * * *